United States Patent
Cho et al.

(10) Patent No.: US 9,337,030 B2
(45) Date of Patent: May 10, 2016

(54) METHOD TO GROW IN-SITU CRYSTALLINE IGZO USING CO-SPUTTERING TARGETS

(71) Applicant: Intermolecular Inc., San Jose, CA (US)

(72) Inventors: Seon-Mee Cho, Santa Clara, CA (US); Stuart Brinkley, Sunnyvale, CA (US); Anh Duong, Fremont, CA (US); Majid Gharghi, San Jose, CA (US); Sang Lee, San Jose, CA (US); Minh Huu Le, San Jose, CA (US); Karl Littau, Palo Alto, CA (US); Jingang Su, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/549,158

(22) Filed: Nov. 20, 2014

(65) Prior Publication Data

US 2015/0279670 A1   Oct. 1, 2015

Related U.S. Application Data

(60) Provisional application No. 61/970,660, filed on Mar. 26, 2014.

(51) Int. Cl.
  *H01L 21/02* (2006.01)
  *H01L 29/786* (2006.01)

(52) U.S. Cl.
  CPC .... *H01L 21/02565* (2013.01); *H01L 21/02554* (2013.01); *H01L 21/02631* (2013.01); *H01L 29/7869* (2013.01)

(58) Field of Classification Search
  None
  See application file for complete search history.

(56) References Cited

U.S. PATENT DOCUMENTS

| | | | |
|---|---|---|---|
| 7,977,255 B1 | 7/2011 | Scheer | |
| 7,982,216 B2 | 7/2011 | Imai | |
| 8,067,775 B2 | 11/2011 | Miyairi | |
| 8,188,480 B2 | 5/2012 | Itai | |
| 8,293,661 B2 | 10/2012 | Yamazaki | |
| 8,314,637 B2 | 11/2012 | Kato | |
| 8,319,214 B2 | 11/2012 | Imai | |
| 8,389,989 B2 | 3/2013 | Yamazaki | |
| 8,395,716 B2 | 3/2013 | Ishitani | |
| 8,415,665 B2 | 4/2013 | Kimura | |
| 8,455,868 B2 | 6/2013 | Yamazaki | |
| 8,526,567 B2 | 9/2013 | Koyama | |
| 8,629,438 B2 | 1/2014 | Yamazaki | |
| 2009/0020753 A1* | 1/2009 | Jeong | C23C 14/086 257/43 |
| 2010/0117999 A1 | 5/2010 | Matsunaga | |
| 2010/0276683 A1* | 11/2010 | Kim | H01L 29/7869 257/43 |
| 2011/0140100 A1* | 6/2011 | Takata | H01L 29/7869 257/43 |
| 2011/0263079 A1* | 10/2011 | Wang | H01L 21/28506 438/149 |
| 2012/0074399 A1 | 3/2012 | Den Boer | |
| 2012/0187395 A1 | 7/2012 | Koezuka | |
| 2013/0009147 A1 | 1/2013 | Koyama | |

(Continued)

FOREIGN PATENT DOCUMENTS

EP      2504855A1 A   10/2012
WO   WO2012081591A1 A   6/2012

*Primary Examiner* — Michael Jung

(57) ABSTRACT

A co-sputter technique is used to deposit In—Ga—Zn—O films using PVD. The films are deposited in an atmosphere including both oxygen and argon. A heater setpoint of about 300 C results in a substrate temperature of about 165 C. One target includes an alloy of In, Ga, Zn, and O with an atomic ratio of In:Ga:Zn of about 1:1:1. The second target includes a compound of zinc oxide. The films exhibit the c-axis aligned crystalline (CAAC) phase in an as-deposited state, without the need of a subsequent anneal treatment.

17 Claims, 7 Drawing Sheets

(56) References Cited

U.S. PATENT DOCUMENTS

| | | | |
|---|---|---|---|
| 2013/0023087 A1* | 1/2013 | Yamazaki | H01L 29/7869 438/104 |
| 2013/0089940 A1 | 4/2013 | Arai | |
| 2013/0256653 A1* | 10/2013 | Ahn | H01L 29/78696 257/43 |
| 2013/0306466 A1* | 11/2013 | Ning | C23C 14/3407 204/298.13 |
| 2015/0155065 A1* | 6/2015 | Park | H01B 1/02 428/332 |
| 2015/0187574 A1* | 7/2015 | Le | H01L 21/02631 438/104 |
| 2015/0232378 A1* | 8/2015 | Hassan | C03C 17/366 427/165 |

\* cited by examiner

METHOD TO GROW IN-SITU CRYSTALLINE IGZO USING CO-SPUTTERING TARGETS

CROSS-REFERENCE TO RELATED APPLICATIONS

This application claims priority to U.S. Provisional Application Ser. No. 61/970,660 filed on Mar. 26, 2014, which is herein incorporated by reference for all purposes.

TECHNICAL FIELD

The present disclosure relates generally to methods of forming semiconductor channel layers for use in thin film transistors (TFTs) used in display applications.

BACKGROUND

TFTs are employed as switching and/or driving devices in many electronic circuits. As an example, TFTs are used as control devices for pixels in display applications such as flat panel displays (FPD), whether based on active-matrix-liquid-crystal displays (AMLCD), or active-matrix-organic-light-emitting-displays (AMOLED). These FPD are used in televisions, computer monitors, smart phones, tablets, etc. Traditionally, TFTs based on amorphous silicon technology (a-Si) have been used due to the low cost and ease of manufacture. However, a-Si-based TFTs have a number of issues such as low mobility, low ON/OFF current ratios (e.g. higher power), and limited durability. Additionally, TFTs based on a-Si are not transparent, thereby limiting the size of the TFT within the pixel so that the display characteristics are not compromised. With the market moving to higher resolution, higher refresh rate, lower power consumption, lower cost, and larger displays, there is a need to replace a-Si.

Metal-based semiconductor materials (e.g. metal oxides, metal oxy-nitrides, metal oxy-chalcogenides, metal chalcogenides) are candidates for replacing a-Si in display applications. The metal-based semiconductor materials may be amorphous, crystalline, or polycrystalline. The metal-based semiconductor materials include multiple elements. Some examples of metal-based semiconductor materials include those based on In—Ga—Zn—O (IGZO) and related materials, like In—Zn—O (IZO), Zn—Sn—O (ZTO), Hf—In—Zn—O (HIZO), and Al—Zn—Sn—O (AZTO). Some examples of metal oxy-nitrides include Zn—O—N (ZnON), In—O—N (InON), Sn—O—N (SnON). Examples of crystalline metal-based semiconductor materials include c-axis aligned crystalline (CAAC) materials like CAAC-IGZO, or polycrystalline materials like ZnO and In—Ga—O (IGO). In addition to the application of these materials into TFTs, these materials are also being considered for memory (e.g. non-volatile random access memory (RAM)), sensor applications (e.g. image sensors), and central processing units (CPU). Some of these materials exhibit stable amorphous phases, high mobility (e.g. >5 cm$^2$/Vs), low threshold voltage (dose to zero, e.g. in a range of −1.0V to +2.0V), low carrier concentrations (e.g. $10^{16}$-$10^{17}$ cm$^{-3}$), high ON/OFF current ratios (e.g. >$10^6$), and high durability (e.g. negative bias temperature illumination stress NBTIS with threshold voltage shift in a range of −1.5V to +0.5V). However, since these materials are multinary compounds (e.g. three or more elements), their performance and properties are sensitive to factors such as composition, concentration gradients, deposition parameters, post-deposition treatments, interactions with adjacent materials, and the like. Further, since the electrical, physical, and chemical behavior of these materials is difficult or impossible to model, much of the development and optimization must be accomplished empirically. Comprehensive evaluation of the entire composition range and deposition parameter space for the formation of a TFT device utilizing these materials requires thousands or millions of experiments.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, a co-sputter technique is used to deposit In—Ga—Zn—O films using PVD. The films are deposited in an atmosphere including both oxygen and argon. A heater setpoint of about 300 C results in a substrate temperature of about 165 C. One target includes an alloy of In, Ga, Zn, and O with an atomic ratio of In:Ga:Zn of about 1:1:1. The second target includes a compound of zinc oxide. The films exhibit the c-axis aligned crystalline (CAAC) phase in an as-deposited state, without the need of a subsequent anneal treatment.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
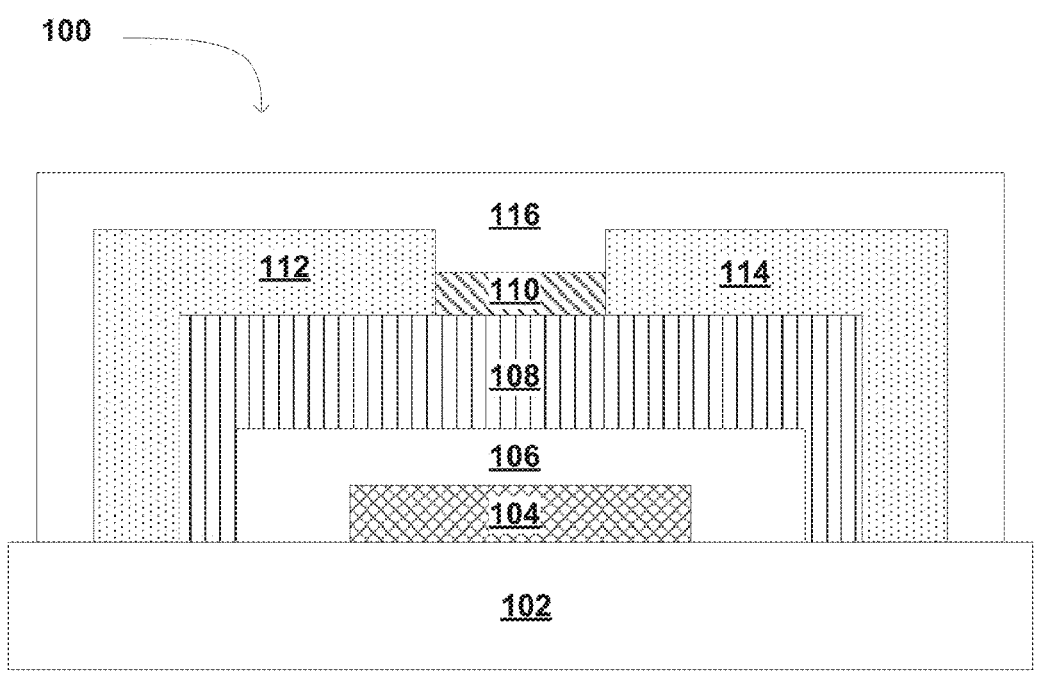
FIG. 1 is a simplified cross-sectional view of a TFT according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, a material (e.g. a dielectric material or an electrode material) will be considered to be "crystalline" if it exhibits greater than or equal to 30% crystallinity as measured by a technique such as x-ray diffraction (XRD).

The term "substrate" as used herein may refer to any workpiece on which formation or treatment of material layers is desired. Substrates may include, without limitation, float glass, low-iron glass, borosilicate glass, display glass, alkaline earth boro-aluminosilicate glass, fusion drawn glass, flexible glass, specialty glass for high temperature processing, polyimide, plastics, polyethylene terephthalate (PET), etc. for either applications requiring transparent or non-transparent substrate functionality.

As used herein, the notation "In—Ga—Zn—O" and "InGaZnO" and "InGaZnO$_x$" will be understood to be equivalent and will be used interchangeably and will be understood to include a material containing these elements in any ratio. Where a specific composition is discussed, the atomic concentrations (or ranges) will be provided. The notation is extendable to other materials and other elemental combinations discussed herein.

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, the terms "above" and "over" will be understood to mean either directly contacting or separated by intervening elements.

As used herein, the term "on" will be understood to mean directly contacting.

As used herein, the term "between" (when used with a range of values) will be understood to mean that both boundary values and any value between the boundaries can be within the scope of the range.

As used herein, the terms "first," "second," and other ordinals will be understood to provide differentiation only, rather than imposing any specific spatial or temporal order.

As used herein, the term "oxide" (of an element) will be understood to include additional components besides the element and oxygen, including but not limited to a dopant or alloy.

As used herein, the term "nitride" (of an element) will be understood to include additional components besides the element and nitrogen, including but not limited to a dopant or alloy.

As used herein, the term "substantially" generally refers to ±5% of a stated value.

Those skilled in the art will appreciate that each of the layers discussed herein and used in the TFT may be formed using any common formation technique such as physical vapor deposition (PVD), atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD) or evaporation. Generally, because of the morphology and size of the display devices, PVD or PECVD are preferred methods of formation. However, any of these techniques are suitable for forming each of the various layers discussed herein. Those skilled in the art will appreciate that the teachings described herein are not limited by the technology used for the deposition process.

Figure 3:
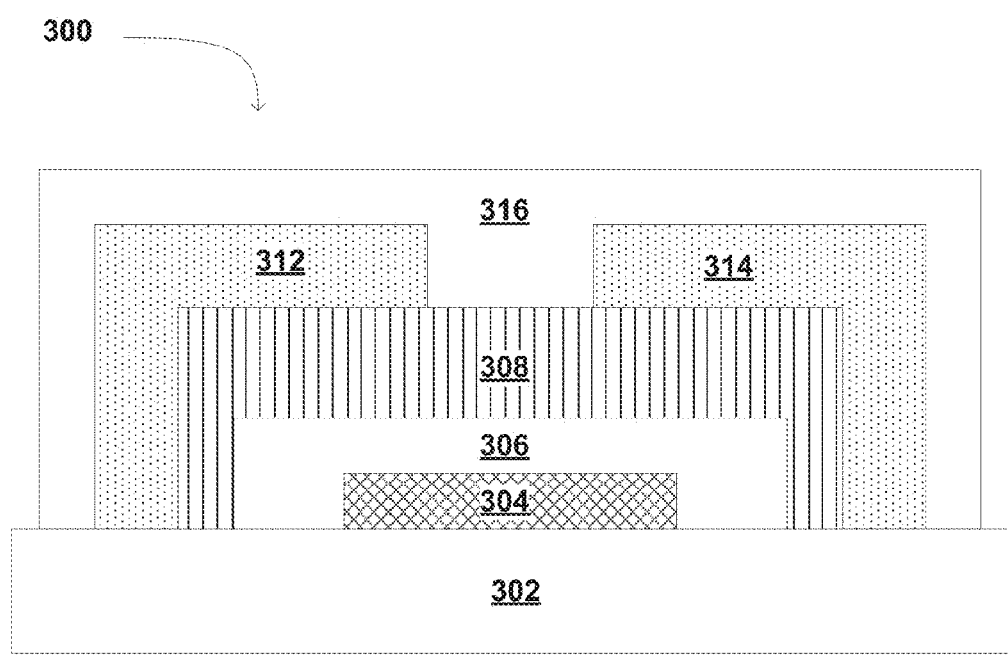
FIG. 3 is a simplified cross-sectional view of a TFT according to some embodiments.

In FIGS. 1 and 3, a TFT stack is illustrated using a simple inverted-staggered, bottom-gate, with etch-stopper island, device structure. Those skilled in the art will appreciate that the description and teachings herein can be readily applied to any simple or complex TFT structure, including inverted-staggered, bottom-gate, back-channel-etch device structures, co-planar device structures, inverted-staggered, bottom-gate, etch-stopper contact (via) hole device structures, self-aligned, inverted-staggered, bottom-gate, etch-stopper island device structures, and various device structures based on top-gate, bottom-gate, staggered, inverted-staggered, co-planar, back-channel-etch, single-gate, or double-gate features. The drawings are for illustrative purposes only and do not limit the application of the present disclosure.

As used herein, the notation "(IIIA)" will be understood to represent the sum of the concentrations of all Group-IIIA elements. This notation will be used herein in calculations of the composition ratios of various elements. This notation will be understood to extend to each of the other Groups of the periodic table respectively (e.g. "(IA)", "(IIA)", "(IVA)", "(VIA)", "(IB)", "(IIB)", etc.).

As used herein, the notation "In—Ga—Zn—O" will be understood to include a material containing these elements in any ratio. This notation will be shortened to "IGZO" for brevity. Where a specific composition is discussed, the atomic concentrations (or ranges) will be provided. The notation is extendable to other materials and other elemental combinations.

As used herein, the notation "In$_x$Ga$_y$Zn$_z$O$_w$" will be understood to include a material containing these elements in a specific ratio given by x, y, z, and w (e.g. In$_{33}$Ga$_{33}$Zn$_{33}$ contains 33 atomic % In, 33 atomic % Ga, and 33 atomic % Zn). The notation is extendable to other materials and other elemental combinations.

As used herein, the notation "$(In,Ga)_x(Zn,Cd)_y(O,Se,S,Te)_z$" will be understood to include a material containing a total amount of Group-IIIA elements (i.e. In plus Ga, etc.) in a ratio given by "x", a total amount of Group-IIB elements (i.e. Zn plus Cd, etc), etc. in a ratio given by "y", and a total amount of Group-VIA elements (i.e. O plus Se plus S plus Te, etc.) in a ratio given by "z". The notation is extendable to other materials and other elemental combinations.

The typical materials in a TFT stack consist of a substrate, a diffusion barrier layer, a gate electrode, source electrode, drain electrode, gate insulator, and a semiconducting channel layer, in addition to an optional etch stopper and/or passivation layer. As used herein, "metal-based semiconductor layer", and "metal-based semiconductor material", etc. will be understood to be equivalent and be understood to refer to a layer and/or material related to the channel layer. This disclosure will describe methods and apparatus for forming and evaluating at least portions of TFT devices based on metal-based semiconductor materials. The metal-based semiconductor materials may include at least one of metal oxides, metal oxy-nitrides, metal oxy-chalcogenides, or metal chalcogenides. In—Ga—Zn—O (IGZO), will be used as an example of a metal-based semiconductor material for purposes of illustration, but this is not intended to be limiting. Those skilled in the art will understand that the present disclosure can be applied to any suitable metal-based semiconductor material applicable to TFT devices.

As used herein, "single grading" and "single gradient" will be understood to describe cases wherein a parameter (e.g. element concentration) varies throughout the thickness of a film or layer and further exhibits a smooth variation. Examples of suitable parameters used herein will include the atomic concentration of a specific elemental species (i.e. composition variation) throughout the thickness of a film or layer, and bandgap energy variation throughout the thickness of a film or layer.

As used herein, "double grading" and "double gradient" will be understood to describe cases wherein a parameter (e.g. element concentration) varies throughout the thickness of a film or layer and further exhibits a variation wherein the value of the parameter is smaller toward the middle of the film or layer with respect to either end of the film or layer. It is not a requirement that the value of the parameter be equivalent at the two ends of the film or layer. Examples of suitable parameters used herein will include the atomic concentration of a specific elemental species (i.e. composition variation) throughout the thickness of a film or layer, and bandgap energy variation throughout the thickness of a film or layer.

FIG. 1 is a simplified cross-sectional view of a TFT according to some embodiments. Bottom gate electrode, 104, is formed above substrate, 102. As discussed previously, the substrate may be any commonly used substrate for display devices such as one of float glass, low-iron glass, borosilicate glass, display glass, alkaline earth boro-aluminosilicate glass, fusion drawn glass, flexible glass, specialty glass for high temperature processing, polyimide, plastics, PET, etc. for either applications requiring transparent or non-transparent substrate functionality. For substrates with no need for transparency, substrates like aluminum foil, stainless steel, carbon steel, paper, cladded foils, etc. can be utilized. The substrate optionally is covered by a diffusion barrier, (e.g. silicon oxide, silicon nitride, or silicon oxy-nitride). The bottom gate electrode, 104, is typically formed by a deposition process followed by a patterning process. Optionally, an anneal step is implemented prior to patterning, post patterning, or both. A typical deposition method involves sputter deposition. Patterning is typically performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode.

Gate dielectric, 106, is formed above bottom gate electrode, 104. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The gate dielectric, 106, is typically formed by a deposition process followed by a patterning process. Optionally, an anneal step is implemented prior to patterning, post patterning, or both. The gate dielectric, 106, may be formed using deposition techniques such as PVD, ALD, or PECVD, or a combination thereof. The performance of the gate dielectric can be sensitive to composition and process parameters. The gate dielectric, 106, may be patterned using either wet techniques such as chemical etching, or dry techniques such as reactive ion etching (RIE). In both of these techniques, parameters such as the uniformity, etch rate, selectivity, critical dimension loss, taper angle, cost, throughput, etc. are sensitive to the process parameters of the etch process.

Metal-based semiconductor layer, 108, is formed above gate dielectric, 106. The metal-based semiconductor layer, 108, is typically formed by a deposition process followed by a patterning process. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the metal-based semiconductor layer may be treated prior to etch stopper or source/drain deposition with a plasma containing $O_2$ or $N_2O$. The metal-based semiconductor layer, 108, may be formed using deposition techniques such as PVD, MOCVD, or wet depositions, (e.g. based on sol-gels). The performance of the metal-based semiconductor layer can be sensitive to composition and process parameters. Examples of suitable materials for the metal-based semiconductor layer include indium gallium zinc oxide (In—Ga—Zn—O or IGZO), amorphous silicon, low-temperature polysilicon, IN—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in the metal-based semiconductor material (e.g. IGZO) may be partially or completely replaced by Ag, As, Au, Bi, Cd, Cu, Zn, Ga, Ge, Hg, In, Pb, Sb, Sn, and Tl. Other dopants of interest include halogens like Cl and F. The metal-based semiconductor layer, 108, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process. This disclosure will use IGZO as an example, but this is not meant to be limiting. The techniques described herein can be applied to any material suitable for display applications.

Etch stopper, 110, is formed above metal-based semiconductor layer, 108. The etch stopper, 110, is typically formed by a deposition process followed by a patterning process. Optionally, an anneal step is implemented prior to patterning, post patterning, or both. The etch stopper, 110, may be formed using deposition techniques such as PVD, ALD, PECVD, or by wet coating techniques. The performance of the etch stopper can be sensitive to composition and process parameters. Examples of suitable materials for the etch stopper include silicon oxide, silicon nitride, a stack of silicon nitride and silicon oxide, a mixture, multi-layer, or combination thereof of a high bandgap material (e.g. silicon oxide, or aluminum oxide) and high-k dielectric material (e.g. hafnium oxide, zirconium oxide, titanium oxide), a high bandgap (e.g. silicon oxide, or aluminum oxide) or high-k dielectric material (e.g. hafnium oxide, zirconium oxide, titanium oxide). In addition to these inorganic materials, various organic materials may be used as etch stopper materials as well. Examples of organic etch stopper materials include photoresist, organic polymers, UV-curable polymers, and heat-curable polymers. The etch stopper, 110, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Source and drain electrodes, 112 and 114, are formed above etch stopper, 110 and exposed regions of the metal-based semiconductor layer, 108. The source and drain electrodes, 112 and 114, are typically formed by a deposition process followed by a patterning process. Optionally, an anneal step is implemented prior to patterning, post patterning, or both. The source and drain electrodes, 112 and 114, may be formed using deposition techniques such as PVD, wet deposition (e.g. plating), or MOCVD (for TCOs). Typically, the deposition steps involve sputter deposition. Patterning is commonly performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The performance of the source and drain electrodes can be sensitive to composition and process parameters. The source/drain electrode is most commonly a stack of two or more layers. Examples of suitable materials for the bottom source/drain electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source and drain electrodes, 112 and 114, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Passivation layer, 116, is formed above source and drain electrodes, 112 and 114. The passivation layer, 116, is typically formed by a deposition process followed by a patterning process. Optionally, an anneal step is implemented prior to patterning, post patterning, or both. The passivation layer, 116, may be formed using deposition techniques such as PVD, ALD, or PECVD, or by wet coating techniques. The performance of the passivation layer can be sensitive to composition and process parameters. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer, 116, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

Figure 2:
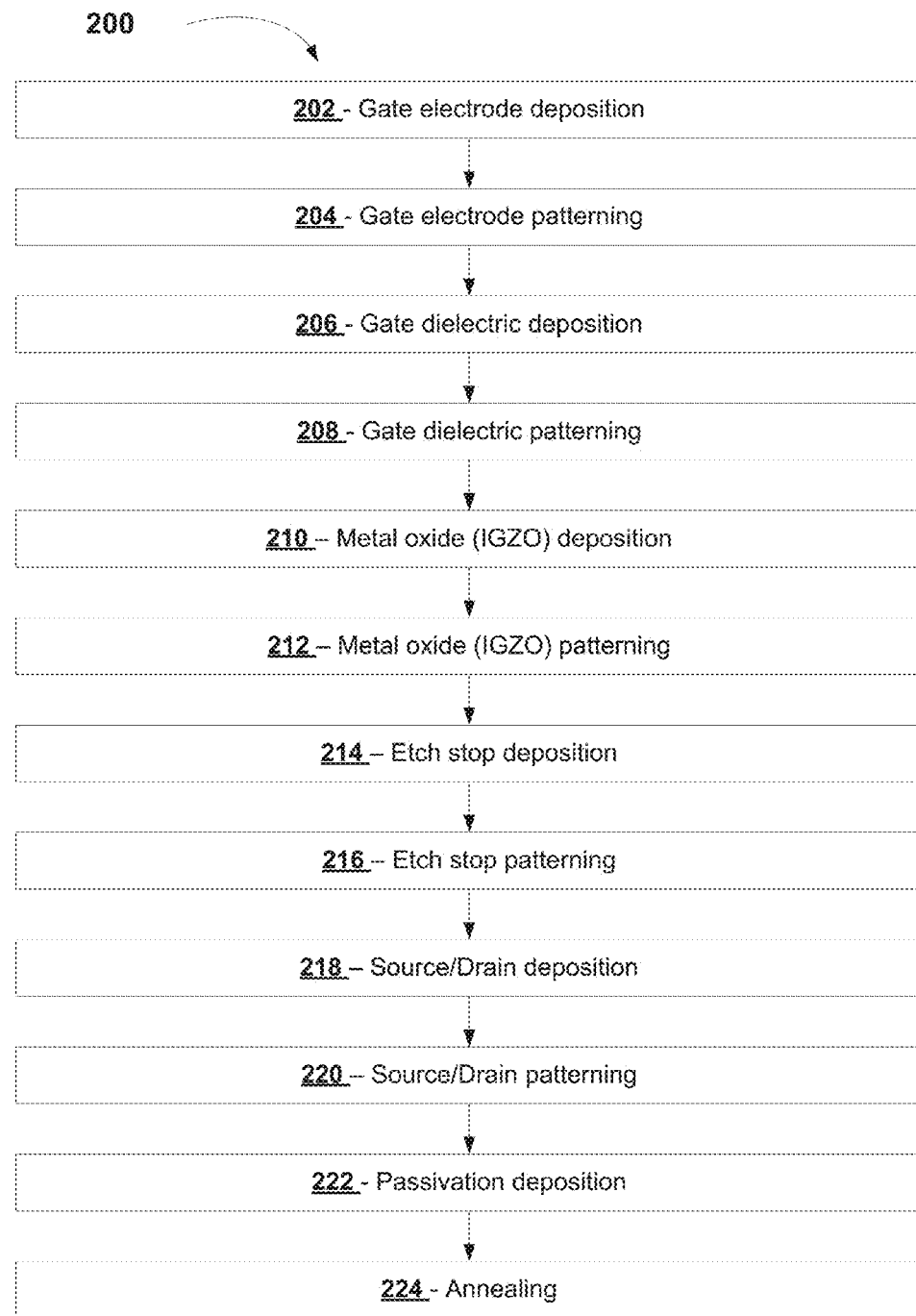
FIG. 2 is a flow chart illustrating the steps of a method according to some embodiments.

FIG. 2 is a flow chart illustrating the steps of a method according to some embodiments. In step 202, a gate electrode layer is deposited above the substrate. Typically, the gate electrode is a material with high conductivity such as a metal, metal alloy, or conductive metal compound (e.g. titanium nitride, tantalum nitride, and the like). Examples of suitable materials for the gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode. The gate electrode layer can be deposited using well known deposition techniques such as PVD, CVD, PECVD, PLD, evaporation, etc.

In step 204, the gate electrode layer is patterned. The gate electrode layer is patterned using known photolithography techniques followed by etching the gate electrode layer using wet and/or dry etching processes. In some embodiments, the gate electrode layer is etched using a combination of wet and dry etching processes. Examples of wet etching processes include the application of acidic, basic, or organic-solvent based solutions (depending on the material to be etched) to the gate electrode layer. Examples of dry etching processes include reactive ion etching (RIE), plasma etching, ion milling, and the like.

In step 206, a gate dielectric layer is deposited above the gate electrode layer. Typically, the gate dielectric is an insulating material such as a silicon oxide, silicon nitride, or a metal oxide such as aluminum oxide, and the like. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 208, the gate dielectric layer is patterned. Optionally, an anneal step is implemented prior to patterning, post patterning, or both. The gate dielectric layer is patterned using known photolithography techniques followed by etching the gate dielectric layer using wet and/or dry etching processes. In some embodiments, the gate dielectric layer is etched using a combination of wet and dry etching processes. Examples of wet etching processes include the application of acidic, basic, or organic-solvent based solutions (depending on the material to be etched) to the gate dielectric layer. Examples of dry etching processes include reactive ion etching (RIE), plasma etching, ion milling, and the like.

In step 210, a metal-based semiconductor layer is deposited above the gate dielectric layer. Examples of suitable materials for the semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in IGZO may be partially or completely replaced by Ag, As, Au, Bi, Cd, Cu, Zn, Ga, Ge, Hg, In, Pb, Sb, Sn, and Tl. Other dopants of interest include halogens like Cl and F. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 212, the metal-based semiconductor layer is patterned. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the semiconductor layer may be treated prior to etch stopper or source/drain deposition with a plasma containing $O_2$ or $N_2O$. The metal-based semiconductor layer is patterned using known photolithography techniques followed by etching the metal-based semiconductor layer using wet and/or dry etching processes. In some embodiments, the metal-based semiconductor layer is etched using a combination of wet and dry etching processes. Examples of wet etching processes include the application of acidic, basic, or organic-solvent based solutions (depending on the material to be etched) to the metal-based semiconductor layer. Examples of dry etching processes include reactive on etching (RIE), plasma etching, ion milling, and the like.

In step 214, an etch stop layer is deposited above the metal-based semiconductor layer. Examples of suitable materials for the etch stopper include silicon oxide, silicon nitride, a stack of silicon nitride and silicon oxide, a mixture, multi-layer, or combination thereof of a high bandgap material (e.g. silicon oxide, or aluminum oxide) and high-k dielectric material (e.g. hafnium oxide, zirconium oxide, titanium oxide), a high bandgap (e.g. silicon oxide, or aluminum oxide) or high-k dielectric material (e.g. hafnium oxide, zirconium oxide, titanium oxide). In addition to these inorganic materials, various organic materials may be used as etch stopper materials as well. Examples of organic etch stopper materials include photoresist, organic polymers, UV-curable polymers, and heat-curable polymers. In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 216, the etch stop layer is patterned. Optionally, an anneal step is implemented prior to patterning, post patterning, or both. The etch stop layer is patterned using known photolithography techniques followed by etching the etch stop layer using wet and/or dry etching processes. In some embodiments, the etch stop layer is etched using a combination of wet and dry etching processes. Examples of wet etching processes include the application of acidic, basic, or organic-solvent based solutions (depending on the material to be etched) to the etch stop layer. Examples of dry etching processes include reactive ion etching (RIE), plasma etching, ion milling, and the like. When dry processes are used, the upper surface of the underlying metal-based semiconductor layer may become damaged, negatively affecting the transport properties. This may require an additional step to remove a portion of the upper surface of the underlying metal-based semiconductor layer to recover the required transport properties.

In step 218, a source/drain electrode layer is deposited above the etch stop layer. The source and drain electrodes are typically deposited as a single layer and then defined during the patterning step. Typically, the source/drain electrode is a material with high conductivity such as a metal, metal alloy, or conductive metal compound (e.g. titanium nitride, tantalum nitride, and the like). Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source/drain electrode layer can be deposited using well known deposition techniques such as PVD, CVD, PECVD, PLD, evaporation, etc.

In step 220, the source/drain electrode layer is patterned into individual source and drain electrodes. Optionally, an anneal step is implemented prior to patterning, post patterning, or both. The source/drain electrode layer is patterned using known photolithography techniques followed by etching the source/drain electrode layer using wet and/or dry etching processes. In some embodiments, the source/drain electrode layer is etched using a combination of wet and dry etching processes. Examples of wet etching processes include the application of acidic, basic, or organic-solvent based solutions (depending on the material to be etched) to the source/drain electrode layer. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. Examples of dry etching processes include reactive on etching (RIE), plasma etching, on milling, and the like. The performance of the source and drain electrodes can be sensitive to composition and process parameters.

In step 222, a passivation layer is deposited above the source/drain layer to form a TFT stack. Typically, the passivation layer is an insulating material such as a silicon oxide, silicon nitride, or a metal oxide such as aluminum oxide, and the like. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer can be deposited using well known deposition techniques such as PVD, CVD, PECVD, PLD, evaporation, etc.

In step 224, the TFT stack is annealed. The annealing serves to passivate defects that may have been formed during any of the deposition, previous anneal steps, and/or etching steps and also serves to control the number of oxygen vacancies that may have been formed in the metal-based semiconductor material. Pending combination of materials, process methods, and process conditions, the annealing might impact both bulk and interface properties, like doping concentrations (and type), defect concentrations (and type), film density (and related long-term durability), and therefore performance metrics like contact resistance, effective mobility, threshold voltage, and TFT stability. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 1500 and 4000 for times between 10 minutes and 60 minutes.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

The performance of the metal-based semiconductor layer will be sensitive to parameters such as composition, crystal structure, oxygen vacancies, surface defects, interface state density, and the like. Many of these parameters will be influenced by the processing of the material and the process conditions to which the material is exposed. As an example, in the method as outlined in FIG. 2, the metal-based semiconductor material is exposed to air (after deposition), photoresist and photoresist developer (during patterning), etch chemistries (either wet, dry, or both), processing conditions related to the deposition of the etch stop layer (e.g. elevated temperatures, plasma bombardment, etc.), processing conditions related to the patterning of the etch stop layer (either wet, dry, or both), and processing conditions related to the deposition of the source/drain layer (e.g. elevated temperatures, plasma bombardment, etc.). Those skilled in the art will understand that the active channel of the metal-based semiconductor layer is protected by the etch stop layer, but that regions of the metal-based semiconductor layer outside the active channel will be exposed to the processing conditions related to the deposition of the source/drain layer.

FIG. 3 is a simplified cross-sectional view of a TFT according to some embodiments. Gate electrode, 304, is formed above substrate, 302. As discussed previously, the substrate may be any commonly used substrate for display devices such as one of float glass, low-iron glass, borosilicate glass, display glass, alkaline earth boro-aluminosilicate glass, fusion drawn glass, flexible glass, specialty glass for high temperature processing, polyimide, plastics, PET, etc. for either applications requiring transparent or non-transparent substrate functionality. For substrates with no need for transparency, substrates like aluminum foil, stainless steel, carbon steel, paper, cladded foils, etc. can be utilized. The substrate optionally is covered by a diffusion barrier, (e.g. silicon oxide, silicon nitride, or silicon oxy-nitride). The bottom gate electrode, 304, is typically formed by a deposition process followed by a patterning process. Optionally, an anneal step is implemented prior to patterning, post patterning, or both. A typical deposition method involves sputter deposition. Patterning is typically performed by photolithography. The photolithography most commonly relies on wet etching, yet dry etching (e.g. reactive on etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode.

Gate dielectric, 306, is formed above bottom gate electrode, 304. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The gate dielectric, 306, is typically formed by a deposition process followed by a patterning process. Optionally, an anneal step is implemented prior to patterning, post patterning, or both. The gate dielectric, 306, may be formed using deposition techniques such as PVD, ALD, or PECVD, or a combination thereof. The performance of the gate dielectric can be sensitive to composition and process parameters. The gate dielectric, 306, may be patterned using either wet techniques such as chemical etching, or dry techniques such as reactive ion etching (RIE). In both of these techniques, parameters such as the uniformity, etch rate, selectivity, critical dimension loss, taper angle, cost, throughput, etc. are sensitive to the process parameters of the etch process.

Metal-based semiconductor layer, 308, is formed above gate dielectric, 306. The metal-based semiconductor layer, 308, is typically formed by a deposition process followed by a patterning process. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the metal-based semiconductor layer may be treated prior to etch stopper or source/drain deposition with a plasma containing $O_2$ or $N_2O$. The metal-based semiconductor layer, 308, may be formed using deposition techniques such as PVD, MOCVD, or wet depositions, (e.g. based on sol-gels). The performance of the metal-based semiconductor layer can be sensitive to composition and process parameters. Examples of suitable materials for the metal-based semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in the metal-based semiconductor material (e.g. IGZO) may be partially or completely replaced by Ag, As, Au, Si, Cd, Cu, Zn, Ga, Ge, Hg, In, Pb, Sb, Sn, and Tl. Other dopants of interest include halogens like Cl and F. The metal-based semiconductor layer, 308, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process. This disclosure will use IGZO as an example, but this is not meant to be limiting. The techniques described herein can be applied to any material suitable for display applications.

Source and drain electrodes, 312 and 314, are formed above the metal-based semiconductor layer, 308. The source and drain electrodes, 312 and 314, are typically formed by a deposition process followed by a patterning process. Optionally, an anneal step is implemented prior to patterning, post patterning, or both. The source and drain electrodes, 312 and 314, may be formed using deposition techniques such as PVD, wet deposition (e.g. plating), or MOCVD (for TCOs). Typically, the deposition steps involve sputter deposition. Patterning is commonly performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The performance of the source and drain electrodes can be sensitive to composition and process parameters. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. R should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (ISO)), and related materials. The source and drain electrodes, 312 and 314, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Passivation layer, 316, is formed above source and drain electrodes, 312 and 314. The passivation layer, 316, is typically formed by a deposition process followed by a patterning process. Optionally, an anneal step is implemented prior to patterning, post patterning, or both. The passivation layer, 316, may be formed using deposition techniques such as PVD, ALD, or PECVD, or by wet coating techniques. The performance of the passivation layer can be sensitive to composition and process parameters. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer, 316, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

Figure 4:
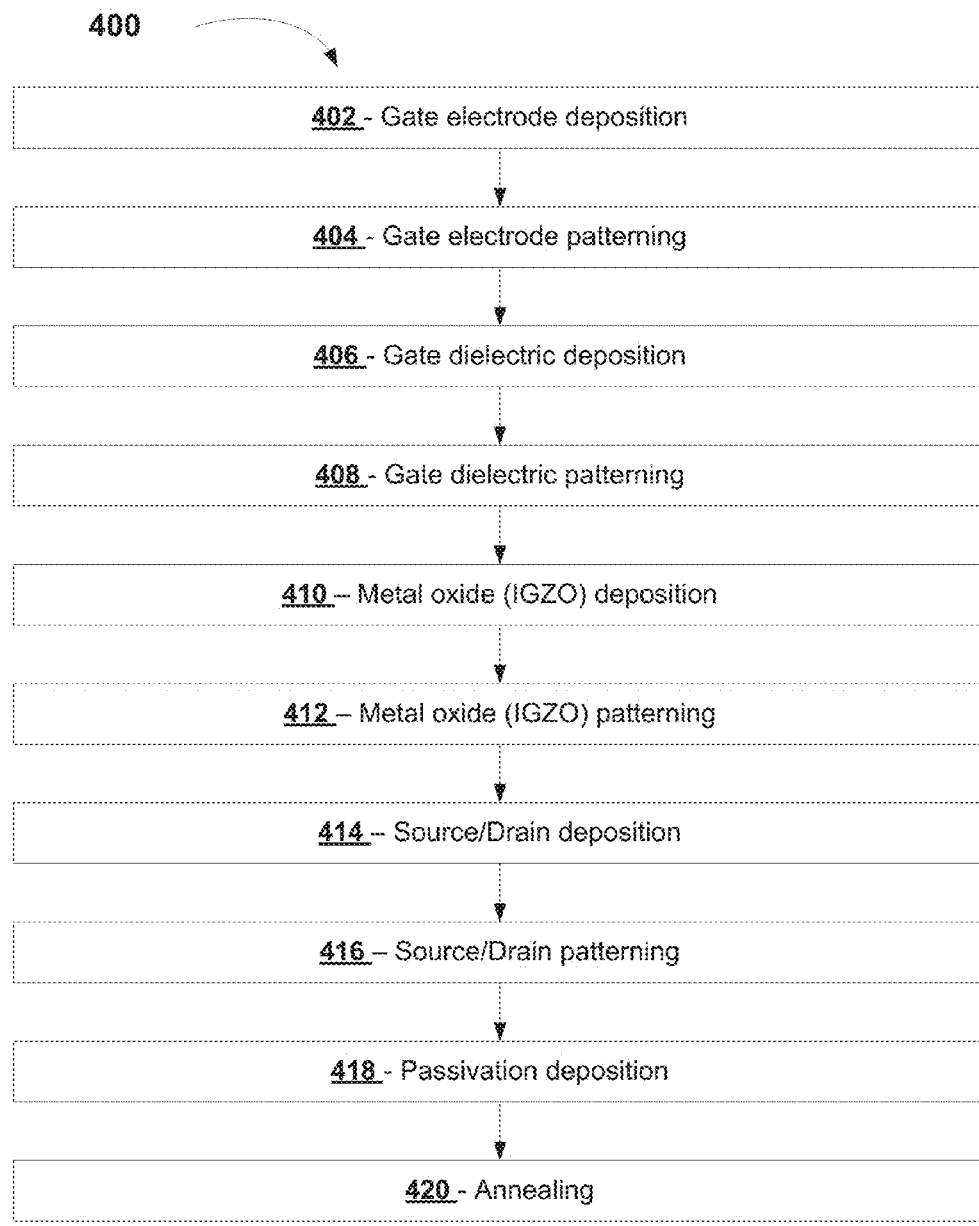
FIG. 4 is a flow chart illustrating the steps of a method according to some embodiments.

FIG. 4 is a flow chart illustrating the steps of a method according to some embodiments. In step 402, a gate electrode layer is deposited above the substrate. Typically, the gate electrode is a material with high conductivity such as a metal, metal alloy, or conductive metal compound (e.g. titanium nitride, tantalum nitride, and the like). Examples of suitable materials for the gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode. The gate electrode layer can be deposited using well known deposition techniques such as PVD, CVD, PECVD, PLD, evaporation, etc.

In step 404, the gate electrode layer is patterned. The gate electrode layer is patterned using known photolithography techniques followed by etching the gate electrode layer using wet and/or dry etching processes. In some embodiments, the gate electrode layer is etched using a combination of wet and dry etching processes. Examples of wet etching processes include the application of acidic, basic, or organic-solvent based solutions (depending on the material to be etched) to the gate electrode layer. Examples of dry etching processes include reactive on etching (RIE), plasma etching, ion milling, and the like.

In step 406, a gate dielectric layer is deposited above the gate electrode layer. Typically, the gate dielectric is an insulating material such as a silicon oxide, silicon nitride, or a metal oxide such as aluminum oxide, and the like. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 408, the gate dielectric layer is patterned. Optionally, an anneal step is implemented prior to patterning, post patterning, or both. The gate dielectric layer is patterned using known photolithography techniques followed by etching the gate dielectric layer using wet and/or dry etching processes. In some embodiments, the gate dielectric layer is etched using a combination of wet and dry etching processes. Examples of wet etching processes include the application of acidic, basic, or organic solvent based solutions (depending on the material to be etched) to the gate dielectric layer. Examples of dry etching processes include reactive ion etching (RIE), plasma etching, ion milling, and the like.

In step 410, a metal-based semiconductor layer is deposited above the gate dielectric layer. Examples of suitable materials for the semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in IGZO may be partially or completely replaced by Ag, As, Au, Bi, Cd, Cu, Zn, Ga, Ge, Hg, In, Pb, Sb, Sn, and Tl. Other dopants of interest include halogens like Cl and F. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 412, the metal-based semiconductor layer is patterned. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the semiconductor layer may be treated prior to etch stopper or source/drain deposition with a plasma containing $O_2$ or $N_2O$. The metal-based semiconductor layer is patterned using known photolithography techniques followed by etching the metal-based semiconductor layer using wet and/or dry etching processes. In some embodiments, the metal-based semiconductor layer is etched using a combination of wet and dry etching processes. Examples of wet etching processes include the application of acidic, basic, or organic-solvent based solutions (depending on the material to be etched) to the metal-based semiconductor layer. Examples of dry etching processes include reactive on etching (RIE), plasma etching, ion milling, and the like.

In step 414, a source/drain electrode layer is deposited above the etch stop layer. The source and drain electrodes are typically deposited as a single layer and then defined during the patterning step. Typically, the source/drain electrode is a material with high conductivity such as a metal, metal alloy, or conductive metal compound (e.g. titanium nitride, tantalum nitride, and the like). Examples of suitable materials for the source/drain electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source/drain electrode layer can be deposited using well known deposition techniques such as PVD, CVD, PECVD, PLD, evaporation, etc.

In step 416, the source/drain electrode layer is patterned into individual source and drain electrodes. Optionally, an anneal step is implemented prior to patterning, post patterning, or both. The source/drain electrode layer is patterned using known photolithography techniques followed by etching the source/drain electrode layer using wet and/or dry etching processes. In some embodiments, the source/drain electrode layer is etched using a combination of wet and dry etching processes. Examples of wet etching processes include the application of acidic, basic, or organic-solvent based solutions (depending on the material to be etched) to the source/drain electrode layer. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. Examples of dry etching processes include reactive ion etching (RIE), plasma etching, ion milling, and the like. The performance of the source and drain electrodes can be sensitive to composition and process parameters.

Optionally, a thin layer of the active channel of the metal-based semiconductor layer is removed after the patterning of the source/drain layer to remove damage introduced during processing (not shown).

In step 418, a passivation layer is deposited above the source/drain layer to form a TFT stack. Typically, the passivation layer is an insulating material such as a silicon oxide, silicon nitride, or a metal oxide such as aluminum oxide, and the like. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer can be deposited using well known deposition techniques such as PVD, CVD, PECVD, PLD, evaporation, etc.

In step 420, the TFT stack is annealed. The annealing serves to passivate defects that may have been formed during any of the deposition and/or etching steps and also serves to reduce the number of oxygen vacancies that may have been formed in the metal-based semiconductor material. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 150 C and 400 C for times between 10 minutes and 60 minutes.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

The performance of the metal-based semiconductor layer will be sensitive to parameters such as composition, crystal structure, oxygen vacancies, surface defects, interface state density, and the like. Many of these parameters will be influenced by the processing of the material and the process conditions to which the material is exposed. As an example, in the method as outlined in FIG. 4, the metal-based semiconductor material is exposed to air (after deposition), photoresist and photoresist developer (during patterning), etch chemistries (either wet, dry, or both), processing conditions related to the deposition of the source/drain layer (e.g. elevated temperatures, plasma bombardment, etc.), and processing conditions related to the patterning of the source/drain layer (either wet, dry, or both). Those skilled in the art will understand that the active channel of the metal-based semiconductor layer is exposed to all of these processing conditions. As discussed previously, typically, a thin layer of the active channel of the metal-based semiconductor layer is removed after the patterning of the source/drain layer to remove damage introduced during processing.

In some embodiments, the metal-based semiconductor layer is based on an IGZO material. Some of these materials exhibit stable amorphous phases, high mobility (e.g. >5 $cm^2$/Vs), low threshold voltage (close to zero, e.g. in a range of −1.0V to +2.0V), low carrier concentrations (e.g. $10^{16}$-$10^{17}$ $cm^{-3}$), high ON/OFF current ratios (e.g. >$10^6$), and high durability (e.g. negative bias temperature illumination stress NBTIS with threshold voltage shift in a range of −1.5V to +0.5V). However, since these materials are multinary compounds (e.g. three or more elements), their performance and properties are sensitive to factors such as composition, concentration gradients, deposition parameters, post-deposition treatments, interactions with adjacent materials, and the like.

During the operation of the TFT, negative gate voltage (e.g. −3V) is applied to turn the TFT OFF. A small amount of leakage current (e.g. leakage current density in the mid $10^{-4}$ $A/cm^2$) may be present. Further, the leakage current is present in the upper portion of the metal-based semiconductor material, near the interface with the source and drain electrodes. It is desirable for the metal-based semiconductor material to have a low conductivity (i.e. high resistivity) under conditions of negative gate voltage, especially at the interface with the source and drain electrodes.

The TFT may be turned ON by applying a positive gate voltage (e.g. +10V). Under these conditions, the current flowing through the TFT can be high (e.g. current density in the mid $10^{+4}$ $A/cm^2$). Further, the current is present in the lower portion of the metal-based semiconductor material, near the interface with the gate dielectric material. It is desirable for the metal-based semiconductor material to have a high conductivity (i.e. low resistivity) under conditions of positive gate voltage, especially at the interface with the gate dielectric material.

The electrical properties of metal-based semiconductor materials may vary as a function of the concentration of one or more of the elements. As an example, the conductivity of IGZO materials is lower when the Ga concentration is higher. Conversely, the conductivity of IGZO materials increases at lower Ga concentrations. Similar relations for multinary metal oxide based semiconductors apply when changing the composition of Al, Hf, and the like in IGZO-like materials where Ga has been partially or completely replaced by Al, Hf, and the like. As an example, the properties of Hf—In—Zn—O (HIZO) can be altered by changing the Hf concentration through the thickness of the film. As an example, the properties of Al—Zn—Sn—O (AZTO) can be altered by changing the Al concentration through the thickness of the film.

The metal oxide based semiconductor layer (e.g. IGZO) may be deposited using any known deposition technique. Typical deposition techniques include PVD and PECVD, however, other deposition techniques such as CVD, ALD, evaporation, and the like could also be used. In some embodiments, the metal oxide based semiconductor layer may be deposited from a single alloy or compound target (in the case of PVD). In some embodiments, the metal oxide based semiconductor layer may be deposited by co-sputtering from multiple alloy or compound targets (in the case of PVD).

In high volume manufacturing, the IGZO layer is typically deposited using a PVD (sputtering) process. The deposition system may be a batch system or an in-line system, but the in-line system is preferred due to higher throughput and lower cost of ownership. The in-line system may be continuous (i.e. the substrates move continuously through the system) or the in-line system may use a "stop and soak" process wherein the substrates are transported to a process station where they stop until the process is completed. In-line systems typically include a number of process stations to allow different compositions to be deposited or to break a long deposition cycle into smaller, balanced, deposition cycles to increase the overall equipment efficiency of the system. At each process station, the substrate may be subjected to small translational oscillations to improve the uniformity of the deposition. This oscillation is not considered part of the transport of the substrate.

Figure 5:
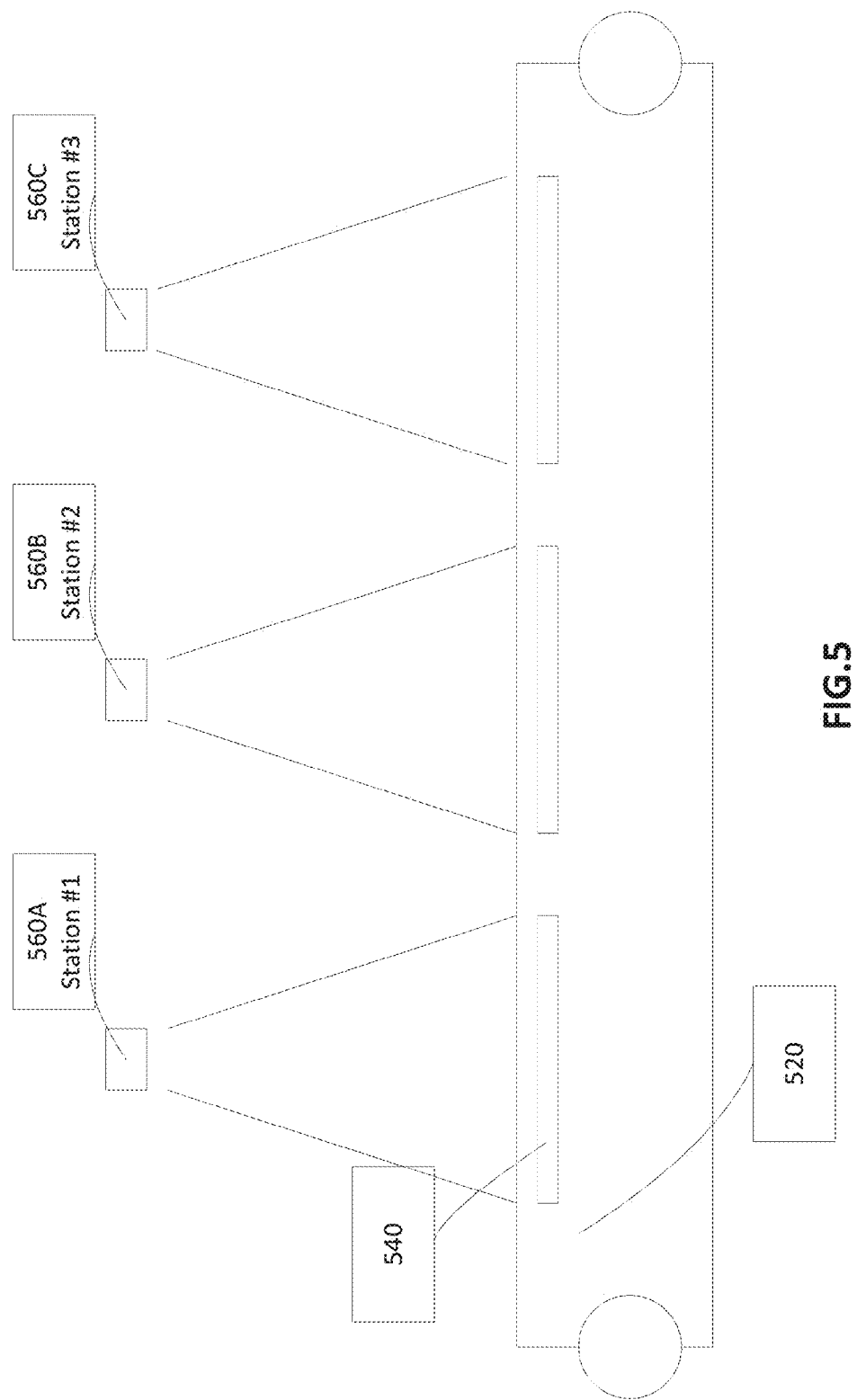
FIG. 5 is a schematic of a system used to deposit layers in accordance with some embodiments.

FIG. 5 illustrates an exemplary in-line deposition (e.g. sputtering) system according to some embodiments. FIG. 5 illustrates a system with three deposition stations, but those skilled in the art will understand that any number of deposition stations can be supplied in the system. For example, the three deposition stations illustrated in FIG. 5 can be repeated and provide systems with 6, 9, 12, etc. targets, limited only by the desired layer deposition sequence and the throughput of the system. A transport mechanism 520, such as a conveyor belt or a plurality of rollers, can transfer substrate 540 between different deposition stations. For example, the substrate can be positioned at station #1, comprising a target assembly 560A, then transferred to station #2, comprising target assembly 560B, and then transferred to station #3, comprising target assembly 560C. Station #1 can be configured to deposit a metal oxide based semiconductor (e.g. IGZO) layer. Station #2 can be configured to deposit an additional IGZO layer with the same or different composition. Station #3 can be configured to deposit an additional IGZO layer with the same or different composition.

The illustration in FIG. 5 depicts a single target at each of the processing stations. In some embodiments, one or more of the processing stations may include multiple targets and co-sputtering may be used to vary the concentration of the metal oxide based semiconductor layer (e.g. IGZO).

In some embodiments, the metal oxide based semiconductor layer (e.g. IGZO) is deposited by co-sputtering from two targets. In this discussion, IGZO will be used as the example of the metal oxide based semiconductor layer. However, those skilled in the art will understand that this discussion can be applied to any of the metal oxide based semiconductor as discussed previously. In some embodiments, the first target comprises In—Ga—Zn—O wherein the atomic ratio of In:Ga:Zn is about 1:1:1. In some embodiments, the second target comprises zinc oxide.

In some embodiments, the IGZO layer is deposited using reactive sputtering wherein oxygen is present with the argon used to form the sputtering atmosphere. The concentration of oxygen can vary from 0 volume % (i.e. pure argon) to 100 volume % (i.e. pure oxygen). Generally, it has been found that it is advantageous to have an oxygen concentration between about 50 volume % and about 100 volume %. In some embodiments, it has been found that it is advantageous to have an oxygen concentration between about 60 volume % and about 80 volume %.

In some embodiments, the IGZO layer is deposited using co-sputtering from two targets. The targets may have the compositions as discussed previously. In some embodiments, power supplied to each target may range from about 5 W/cm$^2$ (e.g. about 100 W over a target with a diameter of 2 inches) and about 22 W/cm$^2$ (e.g. about 450 W over a target with a diameter of 2 inches). The power may be supplied using direct current (DC) or pulsed direct current (P-DC) modes. In some embodiments, the target to substrate spacing may be between about 250 mm and about 350 mm. Those skilled in the art will understand that this parameter may change based on the target size, substrate size, and configuration of the PVD system. In some embodiments, the pressure within the PVD chamber may vary between about 1 mTorr and about 15 mTorr.

Figure 6:
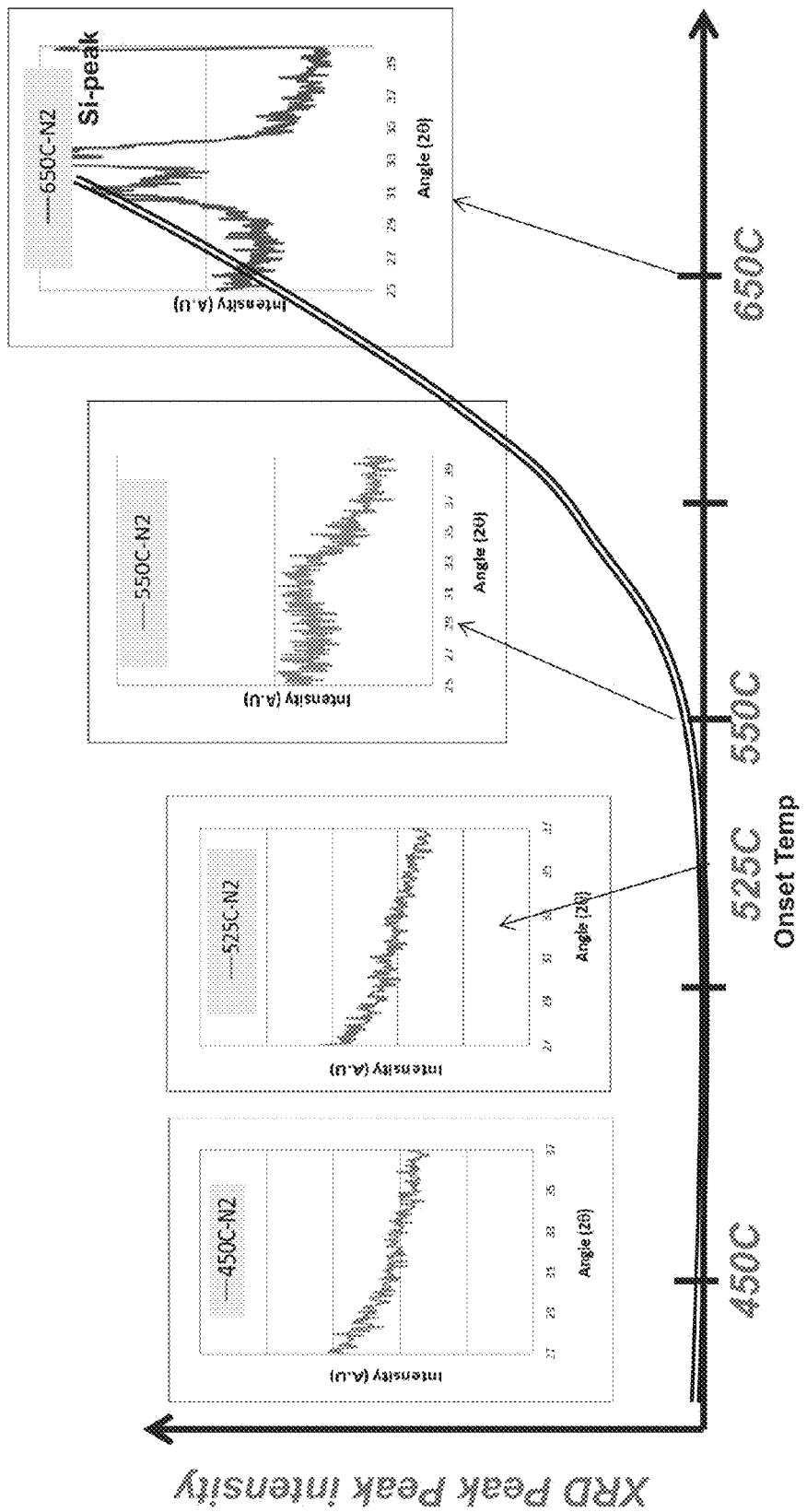
FIG. 6 presents data for the onset of crystallization of IGZO layers in accordance with some embodiments.

FIG. 6 presents data for the onset of crystallization of IGZO layers in accordance with some embodiments. The film was deposited using a single target comprising In—Ga—Zn—O wherein the atomic ratio of In:Ga:Zn is about 1:1:1. The substrate was held at a heater setpoint of about 300 C, which represents a substrate temperature of about 165 C (the substrate is glass). The sputtering atmosphere comprised 80 volume % oxygen and 20 volume % argon at a sputtering pressure of 2 mTorr. The target to substrate spacing was about 260 mm. The films were deposited using 300 W applied to a target having a 2 inch diameter.

The films were annealed in nitrogen for about 60 minutes. The c-axis aligned crystalline (CAAC) phase of IGZO has a pronounced peak at ~31 degrees two-theta when evaluated using XRD. The data presented in FIG. 6 plot the intensity of this peak as a function of annealing temperature. As can be seen, the onset of crystallization for these IGZO films is about 525 C.

Figure 7:
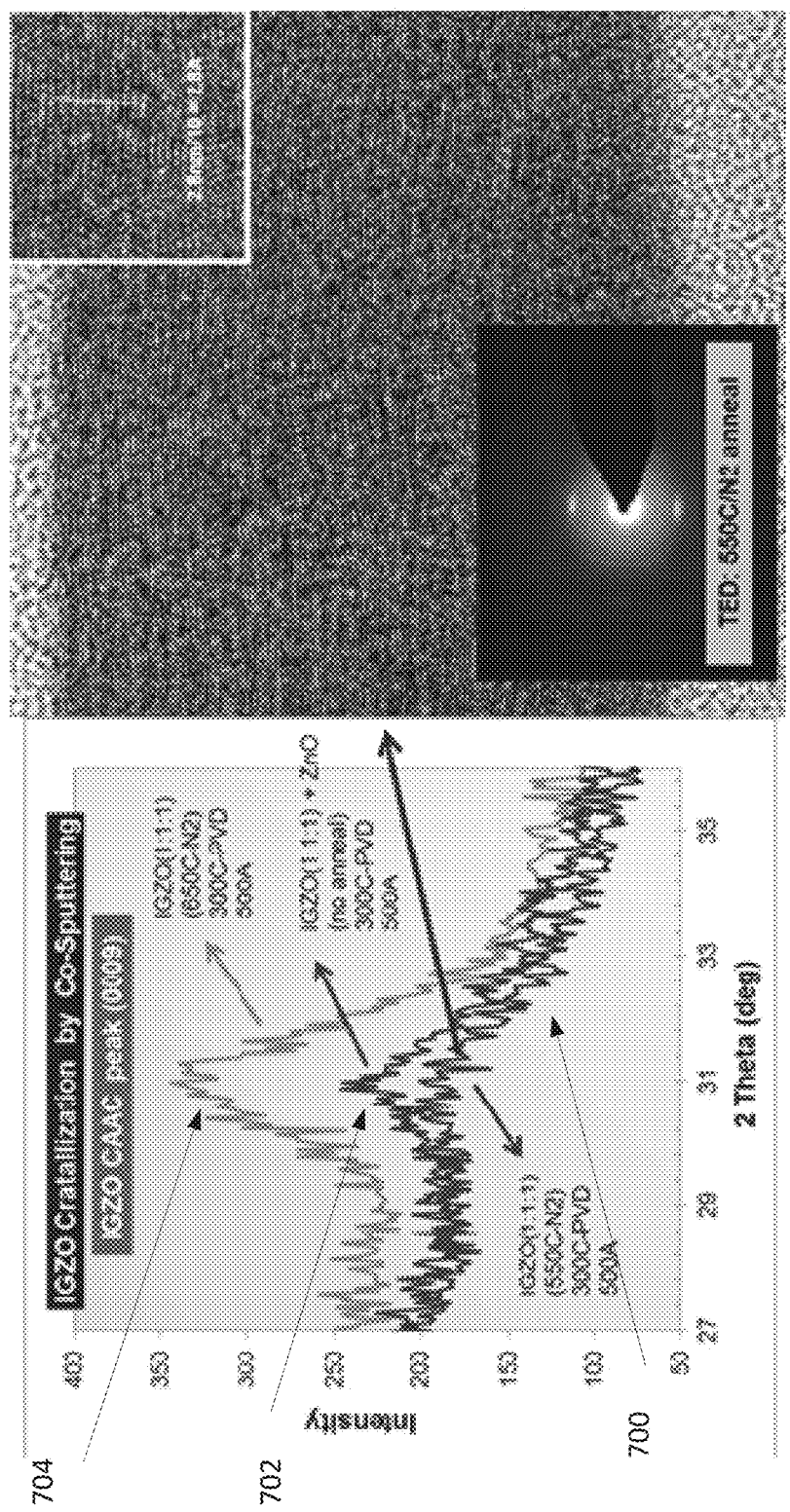
FIG. 7 presents data for the crystallization of IGZO layers in accordance with some embodiments.

FIG. 7 presents data for the onset of crystallization of IGZO layers in accordance with some embodiments. The films represents by the curves marked 700 and 704 were deposited using the same parameters as the films deposited in FIG. 6 as discussed previously. The film represented by the curve marked 700 was annealed in nitrogen for 60 minutes at a temperature of 550 C. The beginning of crystallization is evident by the intensity of the 31 degree two-theta peak. The film represented by the curve marked 740 was annealed in nitrogen for 60 minutes at a temperature of 650 C. The large extent of crystallization is evident by the strong intensity of the 31 degree two-theta peak.

The film represented by the curve marked 702 was deposited using the same parameters as the films deposited in FIG. 6 as discussed previously, except that two targets were used during the deposition. In addition to the IGZO target having an atomic ratio of In:Ga:Zn is about 1:1:1, a second target of zinc oxide was used. The film represented by the curve marked 702 was not annealed. As can be seen from the data, the film represented by the curve marked 702 is at least partially crystallized into the CAAC phase "as-deposited". This is a remarkable and unexpected result. The ability to deposit the high mobility CAAC phase of IGZO without needing a subsequent anneal step allows the IGZO channel material to be applied to low temperature substrates (e.g. plastic substrates) that may not withstand the high temperatures of the anneal process. Further, the use of two sputtering targets allows the composition of the IGZO layer to be varied and tailored to optimize the performance of the TFT device.

Although the foregoing examples have been described in some detail for purposes of clarity of understanding, the invention is not limited to the details provided. There are many alternative ways of implementing the invention. The disclosed examples are illustrative and not restrictive.

What is claimed is:
1. A method comprising:
 providing a substrate;
 providing a first physical vapor deposition target, wherein the first physical vapor deposition target comprises indium, gallium, and zinc;

providing a second physical vapor deposition target, wherein the second physical vapor deposition target consists of zinc oxide; and forming a metal-based semiconductor layer above a surface of the substrate, wherein the forming is performed using the first physical vapor deposition target and the second physical vapor deposition target.

2. The method of claim 1 wherein an atmosphere during the forming comprises oxygen and argon.

3. The method of claim 2 wherein the atmosphere comprises between about 50 volume % and less than about 100 volume % oxygen.

4. The method of claim 3 wherein the atmosphere comprises between about 60 volume % and about 80 volume % oxygen.

5. The method of claim 1 wherein the first physical vapor deposition target consists of indium-gallium-zinc oxide.

6. The method of claim 5 wherein the indium-gallium-zinc oxide of the first physical vapor deposition target has an atomic ratio of In:Ga:Zn of about 1:1:1.

7. The method of claim 5 wherein a power applied to each of the first physical vapor deposition target and the second physical vapor deposition target is between about 5 W/cm$^2$ and about 22 W/cm$^2$.

8. The method of claim 4 wherein a pressure of the atmosphere during the forming is between about 1 mTorr and about 15 mTorr.

9. The method of claim 5 wherein a temperature of the entire substrate during the forming is about 165 C.

10. The method of claim 1 wherein the metal-based semiconductor layer exhibits a c-axis align crystalline structure at the end of the forming.

11. A method comprising:
providing a substrate; and
simultaneously depositing a first material and a second material above a surface of the substrate to form a metal-based semiconductor layer, wherein the first material is ejected from a first physical vapor deposition target and consists of indium, gallium, zinc, and oxygen, and wherein the second material is ejected from a second physical vapor deposition target and consists of zinc and oxygen.

12. The method of claim 11 wherein the first physical vapor deposition target consists of indium-gallium-zinc oxide, and the second physical vapor deposition target consists of zinc oxide.

13. The method of claim 12 wherein the indium-gallium-zinc oxide of the first physical vapor deposition target has an atomic ratio of In:Ga:Zn of about 1:1:1.

14. The method of claim 13 wherein an atmosphere in which said deposition occurs comprises between about 60 volume % and about 80 volume % oxygen.

15. The method of claim 14 wherein a pressure of the atmosphere during said deposition is between about 1 mTorr and about 15 mTorr.

16. The method of claim 15 wherein a power applied to each of the first physical vapor deposition target and the second physical vapor deposition target during said deposition is between about 5 W/cm$^2$ and about 22 W/cm$^2$.

17. The method of claim 16 wherein a temperature of the entire substrate during said deposition is about 165 C.

* * * * *